US010763856B1

(12) United States Patent
Sanchez

(10) Patent No.: US 10,763,856 B1
(45) Date of Patent: Sep. 1, 2020

(54) HIGH VOLTAGE TOLERANT RECEIVER

(71) Applicant: NXP USA, INC., Austin, TX (US)

(72) Inventor: Hector Sanchez, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/569,797

(22) Filed: Sep. 13, 2019

(51) Int. Cl.
*H03K 17/687* (2006.01)
*H03K 19/0185* (2006.01)
*G06F 13/40* (2006.01)

(52) U.S. Cl.
CPC ..... *H03K 17/6872* (2013.01); *G06F 13/4072* (2013.01); *H03K 19/018521* (2013.01)

(58) Field of Classification Search
CPC ........ H03K 17/6872; H03K 19/018521; G06F 13/4072
USPC .................. 327/108–112, 427, 434, 437, 379
See application file for complete search history.

(56) References Cited

U.S. PATENT DOCUMENTS

| | | | | |
|---|---|---|---|---|
| 4,967,169 | A * | 10/1990 | Sun | H03F 1/3241 333/171 |
| 6,181,922 | B1 * | 1/2001 | Iwai | H03H 11/245 326/112 |
| 8,977,217 | B1 * | 3/2015 | Connick | H03K 17/04123 257/368 |
| 9,356,577 | B2 | 5/2016 | Sanchez et al. | |
| 9,503,090 | B2 | 11/2016 | Fifield et al. | |
| 2007/0290744 | A1 * | 12/2007 | Adachi | H03K 17/102 330/51 |
| 2014/0125402 | A1 * | 5/2014 | Chen | H03K 17/693 327/427 |
| 2016/0049922 | A1 * | 2/2016 | Sanchez | G11C 11/4093 327/308 |

OTHER PUBLICATIONS

U.S. Appl. No. 16/509,799, filed Jul. 12, 2019, entitled "Receiver With Configurable Voltage Mode".
Notice of Allowance dated Feb. 13, 2020 in U.S. Appl. No. 16/509,799.

* cited by examiner

*Primary Examiner* — Tomi Skibinski

(57) ABSTRACT

A receiver is provided. The receiver includes a first plurality of transistors configured and arranged as diodes connected in series and coupled between an input terminal and an output terminal. A first transistor of the first plurality is configured and arranged for receiving a signal at the input terminal having a voltage exceeding a voltage rating of the first transistor. A second plurality of transistors is configured and arranged as diodes connected in series and coupled between the output terminal and a voltage supply terminal. A second transistor includes a first current electrode coupled to a control electrode and a first current electrode of the first transistor and a control electrode coupled to a voltage source terminal. A third transistor includes a first current electrode coupled to a second current electrode of the second transistor at a first node. A fourth transistor includes a first current electrode coupled to a second current electrode of the third transistor and a second current electrode coupled at the output terminal.

20 Claims, 3 Drawing Sheets

HIGH VOLTAGE TOLERANT RECEIVER

BACKGROUND

Field

This disclosure relates generally to electronic circuits, and more specifically, to a high voltage tolerant receiver circuit.

Related Art

Today, many modern electronic devices incorporate receiver circuitry for receiving input signals. Such receiver circuits are often required to receive extended voltage range input signals having maximum voltages extending beyond normal operating voltage ranges of the receiver circuits. However, receiver circuits may experience excessive leakage currents and induce signal distortion when receiving these extended voltage range input signals. It is thus desirable to provide a receiver circuit that accommodates a range of input signals while minimizing leakage current and signal distortion.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an I/O receiver with high voltage tolerance and low signal distortion. The receiver circuitry is implemented in a low-voltage process technology and includes a first string of diode connected transistors and a second string of diode connected transistors configured and arranged to attenuate an input signal which exceeds a maximum voltage rated of the transistors. A first capacitor network is connected in parallel with the first string of diode connected transistors and a second capacitor network is connected in parallel with the second string of diode connected transistors. The first and second capacitor networks are configured and arranged for AC-coupling of the input signal. A circuit branch is connected in parallel with the first string of diode connected transistor to provide a logic low voltage value at an output when the input signal is at a logic low voltage level.

Figure 1:
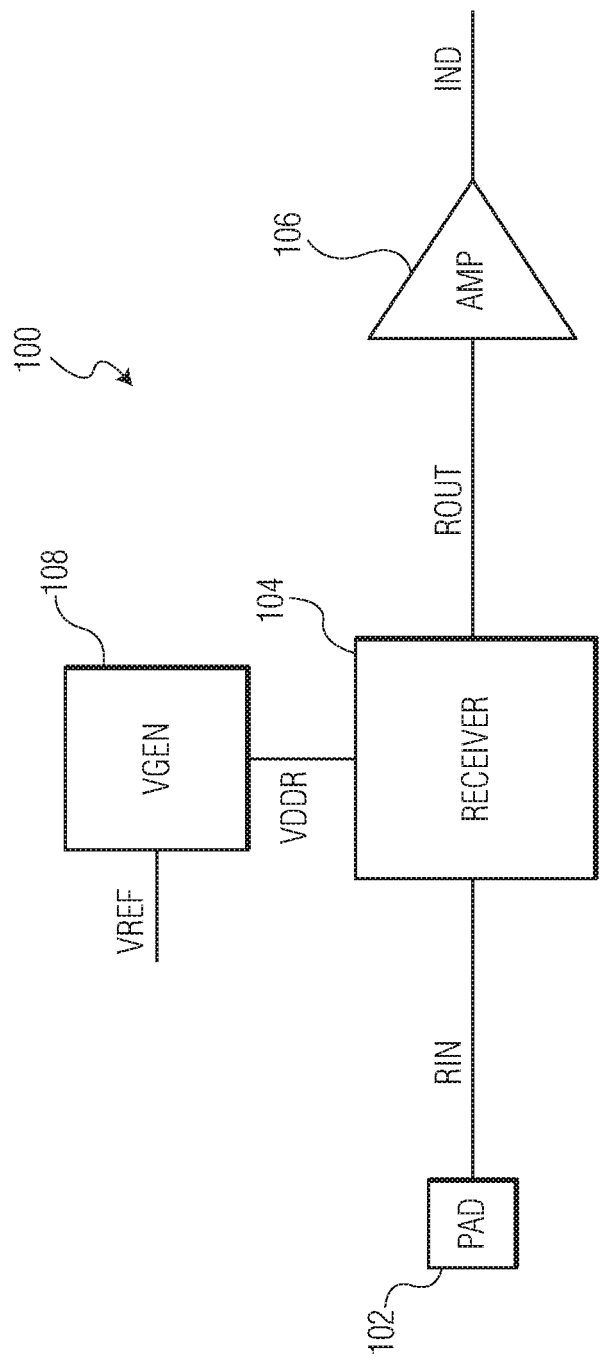
FIG. 1 illustrates, in simplified block diagram form, an example receiver in accordance with an embodiment.

FIG. 1 illustrates, in simplified block diagram form, an example receiver 100 in accordance with an embodiment. Receiver 100 is implemented as an integrated circuit and includes a pad 102 (e.g., bonding pad, bump pad), a receiver block 104, an amplifier 106, and a voltage source block 108. In this embodiment, an input signal RIN is received at an input terminal of the receiver block 104 by way of pad 102 and interconnecting signal line labeled RIN. An output signal ROUT is provided at an output terminal of the receiver block 104 to amplifier 106 by way of signal line labeled ROUT. For illustrative purposes, circuitry and features which may be commonly coupled at an I/O pad (e.g., pad 102) such as electrostatic discharge (ESD) circuitry and output driver circuitry are not shown.

Receiver block 104 includes circuitry configured and arranged to receive input signals which have voltages exceeding a maximum operating voltage rating of transistors used to implement the receiver block 104 as well as input signals which are within the maximum operating voltage rating. The received input signals having voltages exceeding the maximum operating voltage rating are attenuated to be within the maximum operating voltage rating when provided as the output signal ROUT. The ROUT signal is provided to the amplifier 106 and the amplifier 106, in turn, generates an amplified output signal IND serving as input data representative of the received input signal RIN. The amplifier 106 may be implemented as an inverter, a buffer circuit, an operational amplifier, or any other suitable circuit configurations. The voltage source block 108 is configured and arranged to provide a voltage source labeled VDDR based on a reference voltage signal labeled VREF.

Figure 2:
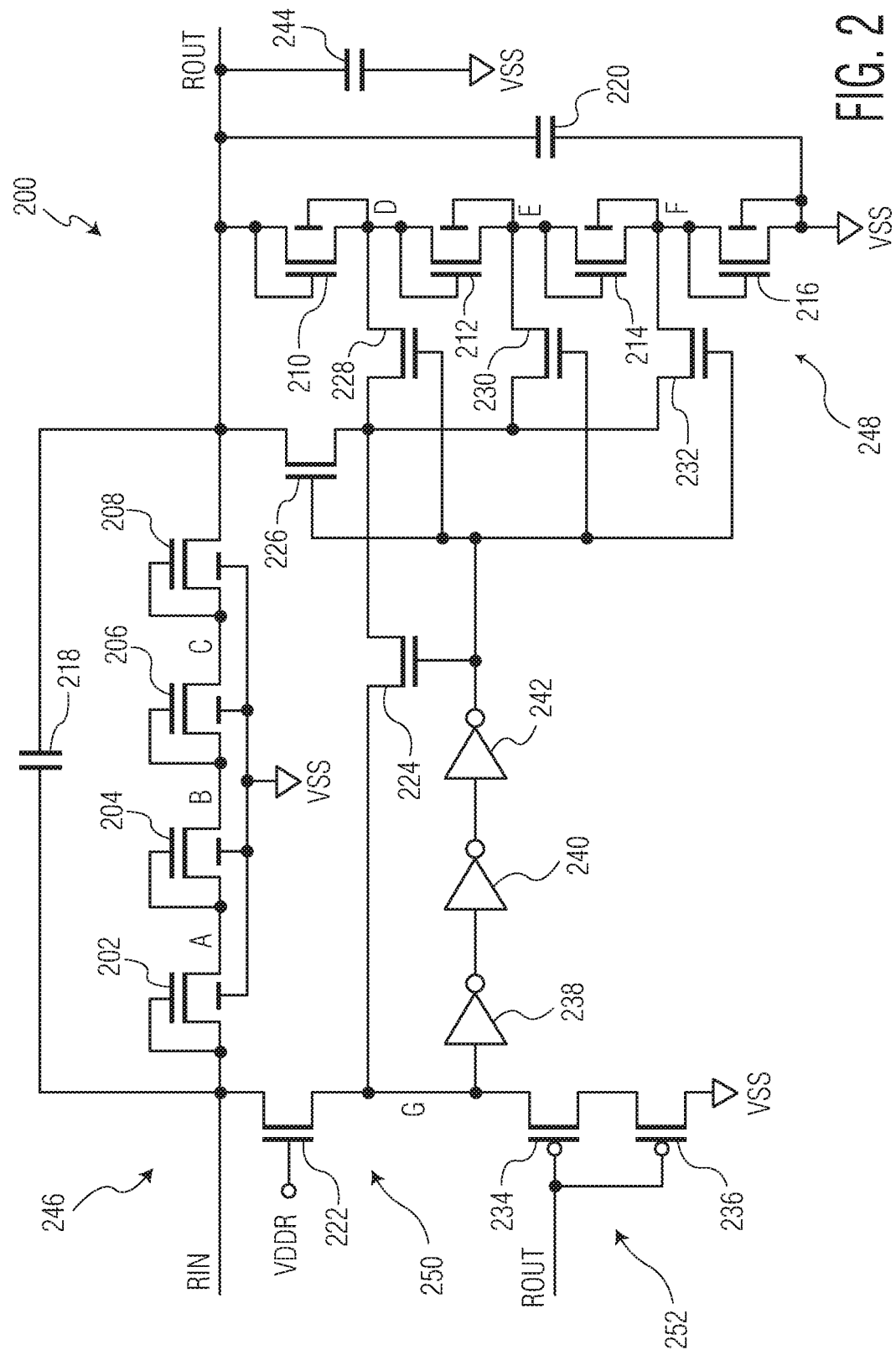
FIG. 2 illustrates, in simplified schematic diagram form, an example implementation of a receiver circuit in accordance with an embodiment.

FIG. 2 illustrates, in simplified schematic diagram form, an example receiver circuit 200 as an implementation of the receiver block 104 depicted in FIG. 1 in accordance with an embodiment. Receiver circuit 200 includes an input terminal RIN for receiving an input signal RIN and an output terminal ROUT for providing an output signal ROUT. In this embodiment, receiver circuit 200 is implemented having a first string (246) of diode connected transistors 202-208 and a circuit branch (250) including transistors 222-232 connected between the RIN terminal and the ROUT terminal, and a second string (248) of diode connected transistors 210-216 connected between the ROUT terminal and a first voltage supply terminal labeled VSS (e.g., ground). A first capacitor network 218 is connected in parallel with the first string of diode connected transistors 202-208 and a second capacitor network 220 is connected in parallel with the second string of diode connected transistors 210-216. Pull-down circuitry 252 includes transistors 234-236 connected to the circuit branch 250 configured to receive the output signal ROUT. In this embodiment, receiver circuit 200 includes circuitry configured and arranged to receive input signals at the RIN terminal which have voltages exceeding a maximum operating voltage rating (e.g., maximum gate-to-source voltage, VGS) of transistors 202-216 and 222-236, for example.

The first string 246 includes diode connected N-channel transistors 202-208. A first current electrode and a control electrode of transistor 202 are connected at the RIN terminal and a second current electrode of transistor 202 is connected to a first current electrode and a control electrode of transistor 204 at node A. A first current electrode and a control electrode of transistor 206 are connected to a second current electrode of transistor 204 at node B and a second current electrode of transistor 206 is connected to a first current electrode and a control electrode of transistor 208 at node C. A second current electrode of transistor 208 is connected at the ROUT terminal. Body electrodes of transistor 202-208 are connected at the VSS supply terminal.

The second string 248 includes diode connected N-channel transistors 210-216. A first current electrode and a control electrode of transistor 210 are connected at the ROUT terminal and a second current electrode of transistor 210 is connected to a body electrode of transistor 210 at node D. A first current electrode and a control electrode of transistor 212 are connected to the second current electrode of transistor 210 at node D and a second current electrode of transistor 212 is connected to a body electrode of transistor 212 at node E. A first current electrode and a control electrode of transistor 214 are connected to the second current electrode of transistor 212 at node E and a second current electrode of transistor 214 is connected to a body electrode of transistor 214 at node F. A first current electrode and a control electrode of transistor 216 are connected to the second current electrode of transistor 214 at node F and a second current electrode of transistor 216 is connected to a body electrode of transistor 216 at the VSS supply terminal.

The circuit branch 250 provides a second signal path from the RIN terminal to the ROUT terminal to accommodate low RIN signals levels (e.g., less than 1.0 volts). The circuit branch 250 includes N-channel transistors 222-232. A first current electrode of transistor 222 is connected at the RIN terminal, a control electrode of transistor 222 is connected to a voltage source terminal labeled VDDR, and a second current electrode of transistor 222 is connected to a first current electrode of transistor 224 at node G. A second current electrode of transistor 224 is connected to first current electrodes of transistors 226-232. A second current electrode of transistor 226 is connected to the ROUT terminal, a second current electrode of transistor 228 is connected at node D, a second current electrode of transistor 230 is connected at node E, and a second current electrode of transistor 232 is connected at node F. In this embodiment, an inverter string including inverters 238-242 is connected between node G and control electrodes of transistors 224-232. An input of inverter 238 is connected at node G and an output of inverter 238 is connected to an input of inverter 240. An output of inverter 240 is connected to an input of inverter 242 and an output of inverter 242 is connected to the control electrodes of transistors 224-232. In other embodiments, the inverter string may be formed as one or more logic gates configured and arranged such that the control electrodes of transistors 224-232 receive a logic value opposite of the logic value at node G. In this embodiment, the circuit branch 250 is configured and arranged to transfer low voltage values (e.g., less than 1.0 volts) at the RIN terminal to the ROUT terminal.

The pull-down circuitry 252 includes P-channel transistors 234-236. A first current electrode of transistor 234 is connected at node G and a second current electrode of transistor 234 is connected to a first current electrode of transistor 236. A second current electrode of transistor 236 is connected at the VSS supply terminal and control electrodes of transistors 234-236 are connected at the ROUT terminal. In this embodiment, transistors 234 and 236 are formed having a same nominal transistor width and a same nominal transistor length. Accordingly, transistors 234 and 236 as connected may be characterized as a single transistor having the nominal transistor width and a transistor length approximately equal to twice the nominal transistor length. In this embodiment, the pull-down circuitry 252 is configured and arranged to cause node G to go to a logic low level when the ROUT signal is at a logic low.

In this embodiment, transistors 202-216 and 222-236 are formed in a process technology having a nominal operating voltage rating and a maximum operating voltage rating. The maximum operating voltage rating for transistors within a given process technology may be based on physical parameters such as gate oxide thickness, effective channel length, and the like. For example, transistors 202-216 and 222-236 may be formed in a process technology having a nominal operating voltage of 1.8 volts and a maximum operating voltage rating (e.g., maximum VGS rating) of 2.0 volts.

Figure 4:
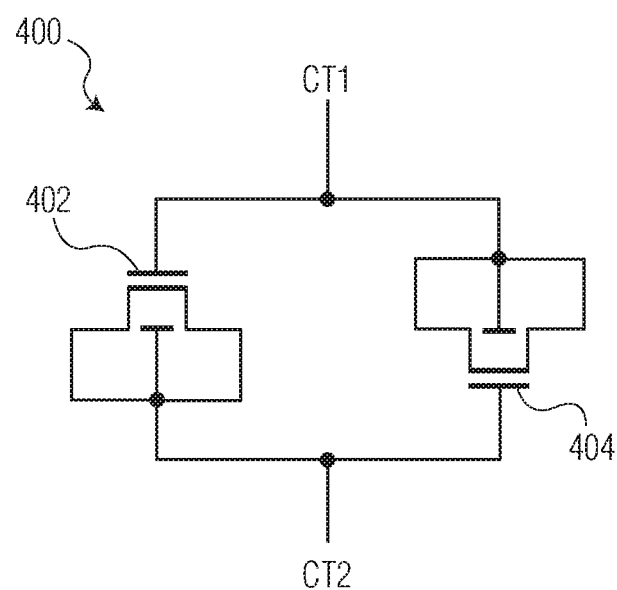
FIG. 4 illustrates, in simplified schematic diagram form, an example implementation of a capacitive element in accordance with an embodiment.

The first capacitor network 218 includes one or more capacitive elements connected in parallel with the first string 246 for AC coupling an input signal at the RIN terminal. The first capacitor network 218 may include any suitable number of capacitive elements configured and arranged for AC coupling the input signal. A first terminal of the first capacitor network 218 is connected at the RIN terminal and a second terminal of the first capacitor network 218 is connected at the ROUT terminal. In this embodiment, each of the capacitive elements may be formed as MOSFET capacitors as depicted in FIG. 4. In other embodiments, each of the capacitive elements of the first capacitor network 218 may be formed as other suitable capacitor types which can be connected to pad 102, for example.

The second capacitor network 220 includes one or more capacitive elements connected in parallel with the second string 248 for AC attenuation of the input signal at the RIN terminal. The second capacitor network 220 may include any suitable number of capacitive elements configured and arranged for AC attenuation of the input signal. A first terminal of the second capacitor network 220 is connected at the ROUT terminal and a second terminal of the second capacitor network 220 is connected at the VSS supply terminal. In this embodiment, each of the capacitive elements may be formed as MOSFET capacitors as depicted in FIG. 4. In other embodiments, each of the capacitive elements of the first capacitor network 220 may be formed as other suitable capacitor types. In this embodiment, the second capacitor network 220 forms a series connection with first capacitor network 218 (e.g., from RIN to VSS) to reduce (e.g., divide) a net capacitance at the ROUT terminal.

The receiver circuit 200 further includes a load (e.g., parasitic capacitance) capacitor 244 connected at the ROUT terminal. A first terminal of capacitor 244 is connected at the ROUT terminal and a second terminal of capacitor 244 is connected at the VSS supply terminal. Capacitor 244 is included for illustrative purposes being representative of parasitic capacitance connected at the ROUT terminal.

In the embodiment depicted in FIG. 2, the input signal received at the RIN terminal may be characterized as a radio frequency (RF) signal having a voltage swing of 0 to 3.3 volts, for example, exceeding the maximum operating voltage rating. The first string 246 of diode connected transistors 202-208 along with the second string 248 of diode connected transistors 210-216 are configured and arranged to provide a desired attenuation of the input signal at the ROUT terminal such that the attenuated signal is within the maximum operating voltage rating. For example, the number and sizes of the diode connected transistors in the first string 246 may be chosen to be same as the same number and sizes as the diode connected transistors in the second string 248 thus providing an approximate 50% attenuation of the input signal at the ROUT terminal. In this embodiment, the circuit branch 250 is configured and arranged to provide a logic low value at the ROUT terminal when the voltage of the input signal received at the RIN terminal is at a low voltage value (e.g., less than 1.0 volts). Because the signal path including the first string 246 and the second string 248 is formed with diode connected transistors 202-216, the circuit branch 250 provides the second signal path including transistors 222-232 for low RIN signals levels to be propagated to the ROUT terminal. For example, when the RIN signal level is low (e.g., 0 volts), the diode connected transistor signal path from the RIN terminal to the ROUT terminal is effectively in a high impedance state and the second signal path propagates a solid 0 volts at the ROUT terminal.

The effective capacitance of the first capacitor network 218 and the effective capacitance of the second capacitor network 220 are predetermined such that a desired AC coupling to minimize distortion of the input signal is provided at the ROUT terminal. For example, the first capacitor network 218 may be designed to have an effective capacitance approximately equal to the effective capacitance of the second capacitor network 220 plus the effective parasitic capacitance (e.g., capacitor 244) coupled at the ROUT terminal to minimize capacitive effects on the signal provided at the ROUT terminal.

Figure 3:
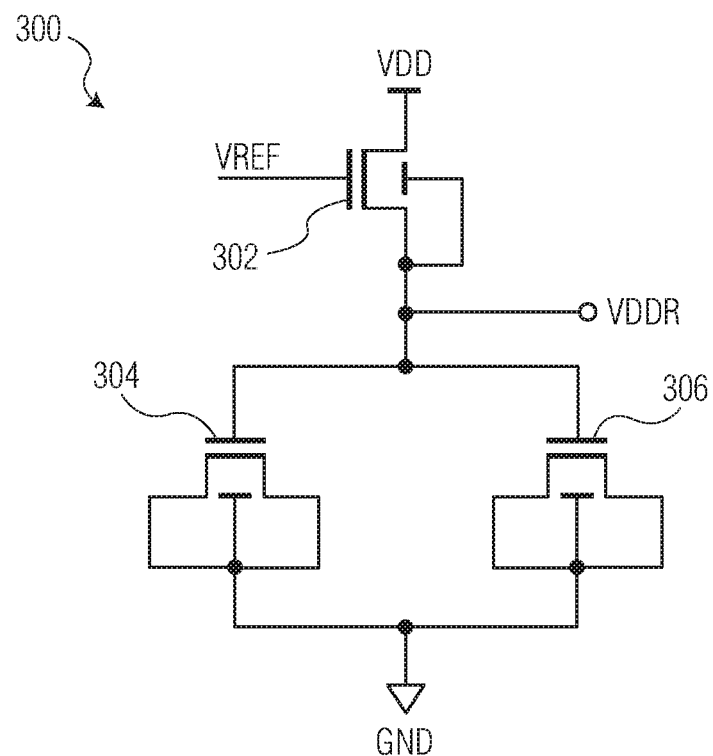
FIG. 3 illustrates, in simplified schematic diagram form, an example implementation of a voltage source in accordance with an embodiment.

FIG. 3 illustrates, in simplified schematic diagram form, an example voltage source 300 as an implementation of the voltage source block 108 depicted in FIG. 1 in accordance with an embodiment. The voltage source 300 includes an input terminal labeled VREF for receiving a reference voltage VREF and an output voltage source terminal labeled VDDR for providing the VDDR voltage to circuitry of receiver 100 (e.g., transistor 222, inverters 238-242, amplifier 106). In this embodiment, the voltage source 300 further includes an N-channel transistor 302 and capacitors 304-306. A first current electrode of transistor 302 is connected to a voltage supply terminal labeled VDD at which a voltage VDD is supplied and a control electrode of transistor 302 is connected to the VREF terminal for receiving the reference voltage VREF. A second current electrode of transistor 302 is connected to a body electrode of transistor 302, first terminals of capacitors 304-306, and the VDDR terminal. Second terminals of capacitors 304-306 are connected to the VSS supply terminal. In this embodiment, capacitors 304-306 are formed from N-channel transistor structures having body electrodes connected to source/drain electrodes forming the second terminals. In other embodiments, capacitors 304-306 may be formed from other suitable capacitor structures. In this embodiment, the VDDR voltage provided at the VDDR terminal is based on the VREF voltage provided at the control electrode of transistor 302. For example, with a VDD voltage of 3.3. volts, a predetermined VREF voltage is provided at the control electrode of transistor 302 to provide a desired VDDR voltage of approximately 1.8 volts.

FIG. 4 illustrates, in simplified schematic diagram form, an example implementation of a capacitive element 400 included in the first and second capacitor networks 218-220 in accordance with an embodiment. The capacitive element 400 includes a first terminal labeled CT1 and a second terminal labeled CT2. In this embodiment, the capacitive element 400 further includes N-channel transistors 402 and 404 configured and arranged as MOSFET capacitors. A control electrode of transistor 402 is connected to the CT1 terminal and a first current electrode, a second current electrode, and a body electrode of transistor 402 is connected to the CT2 terminal in a first orientation. A control electrode of transistor 404 is connected to the CT2 terminal and a first current electrode, a second current electrode, and a body electrode of transistor 404 is connected to the CT1 terminal in a second orientation. In this embodiment, the second orientation of transistor 404 is opposite of the first orientation of transistor 402 allowing for bidirectional capacitor characteristics.

Generally, there is provided, a circuit including a first plurality of transistors configured and arranged as diodes connected in series and coupled between an input terminal and an output terminal, a first transistor of the first plurality configured and arranged for receiving a signal at the input terminal having a voltage exceeding a voltage rating of the first transistor; a second plurality of transistors configured and arranged as diodes connected in series and coupled between the output terminal and a first voltage supply terminal, the second plurality together with the first plurality configured and arranged to attenuate the signal; a second transistor having a first current electrode coupled to a control electrode and a first current electrode of the first transistor and a control electrode coupled to a voltage source terminal; a third transistor having a first current electrode coupled to a second current electrode of the second transistor at a first node; and a fourth transistor having a first current electrode coupled to a second current electrode of the third transistor and a second current electrode coupled at the output terminal. Each transistor of the second plurality may include a first current electrode connected to its control electrode and a second current electrode connected to its body electrode. The circuit may further include an inverter string coupled between the first node and control electrodes of the third and fourth transistors. The circuit may further include a fifth transistor having a first current electrode coupled at the first node, a second current electrode coupled at the first voltage supply terminal, and a control electrode coupled at the output terminal, the fifth transistor having a conductivity type different from a conductivity type of the second transistor. The circuit may further include a fifth transistor having a first current electrode coupled to the second current electrode of the second transistor, a second current electrode coupled between a first diode connected transistor and a second diode connected transistor in the second plurality of transistors, and a control electrode coupled to a control electrode of the third transistor. The circuit may further include a first capacitor network coupled in parallel with the first plurality; and a second capacitor network coupled in parallel with the second plurality. The first capacitor network may include a fifth transistor configured and arranged as a first capacitive element having a control electrode coupled at the input terminal and first and second current electrodes coupled at the output terminal; and a sixth transistor configured and arranged as a second capacitive element having a control electrode coupled at the output terminal and first and second current electrodes coupled at the input terminal. The first capacitor network may be configured to have an effective capacitance approximately equal to an effective capacitance of the second capacitor network and parasitic capacitance coupled at the output terminal. The first plurality and the second plurality each may include the same number of transistors.

In another embodiment, there is provided, a circuit including a first plurality of transistors configured and arranged as diodes connected in series and coupled between an input terminal and an output terminal, each transistor of the first plurality having a body electrode coupled to a first voltage supply terminal; a second plurality of transistors configured and arranged as diodes connected in series and coupled between the output terminal and the first voltage supply terminal; a first transistor of the first plurality having a first current electrode and a control electrode coupled at the input terminal, the first transistor configured and arranged for receiving a signal at the input terminal having a voltage exceeding a voltage rating of the first transistor; a second transistor having a first current electrode coupled to the first current electrode and the control electrode of the first transistor at the input terminal and a control electrode coupled to a voltage source terminal; a third transistor having a first current electrode coupled to a second current electrode of the second transistor at a first node; and a fourth transistor having a first current electrode coupled to a second current electrode of the third transistor and a second current electrode coupled at the output terminal. The circuit may further include a first capacitor network coupled in parallel with the first plurality; and a second capacitor network coupled in parallel with the second plurality. The first capacitor network may include a fifth transistor configured and arranged as a first capacitive element having a control electrode coupled at the input terminal and first and second current electrodes coupled at the output terminal; and a sixth transistor configured and arranged as a second capacitive element having a control electrode coupled at the output terminal and first and second current electrodes coupled at the input terminal. The first capacitor network may be configured and arranged to have an effective capacitance approximately equal to an effective capacitance of the second capacitor network and parasitic capacitance coupled at the output terminal. Each transistor of the second plurality includes a first current electrode connected to its control electrode and a second current electrode connected to its body electrode. The circuit may further include a fifth transistor having a first current electrode coupled at the first node, a second current electrode coupled at the first voltage supply terminal, and a control electrode coupled at the output terminal, the fifth transistor having a conductivity type different from a conductivity type of the second transistor. The circuit may further include a fifth transistor having a first current electrode coupled to the second current electrode of the second transistor, a second current electrode coupled between a first diode connected transistor and a second diode connected transistor in the second plurality of transistors, and a control electrode coupled to a control electrode of the third transistor.

In yet another embodiment, there is provided, a circuit including a first plurality of transistors configured and arranged as diodes connected in series and coupled between an input terminal and an output terminal, each transistor of the first plurality having a body electrode coupled to a first voltage supply terminal; a second plurality of transistors configured and arranged as diodes connected in series and coupled between the output terminal and the first voltage supply terminal, each transistor of the second plurality including a first current electrode connected to its control electrode and a second current electrode connected to its body electrode; a first transistor of the first plurality having a first current electrode and a control electrode coupled at the input terminal, the first transistor configured and arranged for receiving a signal at the input terminal having a voltage exceeding a voltage rating of the first transistor; a second transistor having a first current electrode coupled to the first current electrode and the control electrode of the first transistor at the input terminal and a control electrode coupled to a voltage source terminal; a third transistor having a first current electrode coupled to a second current electrode of the second transistor at a first node; and a fourth transistor having a first current electrode coupled to a second current electrode of the third transistor and a second current electrode coupled at the output terminal. The circuit may further include a first capacitor network coupled in parallel with the first plurality; and a second capacitor network coupled in parallel with the second plurality. The first capacitor network may include a fifth transistor configured and arranged as a first capacitive element having a control electrode coupled at the input terminal and first and second current electrodes coupled at the output terminal; and a sixth transistor configured and arranged as a second capacitive element having a control electrode coupled at the output terminal and first and second current electrodes coupled at the input terminal. The circuit may further include a fifth transistor having a first current electrode coupled at the first node, a second current electrode coupled at the first voltage supply terminal, and a control electrode coupled at the output terminal, the fifth transistor having a conductivity type different from a conductivity type of the second transistor.

By now it should be appreciated that there has been provided, an I/O receiver with high voltage tolerance and low signal distortion. The receiver circuitry is implemented in a low-voltage process technology and includes a first string of diode connected transistors and a second string of diode connected transistors configured and arranged to attenuate an input signal which exceeds a maximum voltage rated of the transistors. A first capacitor network is connected in parallel with the first string of diode connected transistors and a second capacitor network is connected in parallel with the second string of diode connected transistors. The first and second capacitor networks are configured and arranged for AC-coupling of the input signal. A circuit branch is connected in parallel with the first string of diode connected transistor to provide a logic low voltage value at an output when the input signal is at a logic low voltage level.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A circuit comprising:
 a first plurality of transistors configured and arranged as diodes connected in series and coupled between an input terminal and an output terminal, a first transistor of the first plurality configured and arranged for receiv- ing a signal at the input terminal having a voltage exceeding a voltage rating of the first transistor;
a second plurality of transistors configured and arranged as diodes connected in series and coupled between the output terminal and a first voltage supply terminal, the second plurality together with the first plurality configured and arranged to attenuate the signal;
a second transistor having a first current electrode coupled to a control electrode and a first current electrode of the first transistor and a control electrode coupled to a voltage source terminal;
a third transistor having a first current electrode coupled to a second current electrode of the second transistor at a first node; and
a fourth transistor having a first current electrode coupled to a second current electrode of the third transistor and a second current electrode coupled at the output terminal.

2. The circuit of claim 1, wherein each transistor of the second plurality includes a first current electrode connected to its control electrode and a second current electrode connected to its body electrode.

3. The circuit of claim 1, further comprising an inverter string coupled between the first node and control electrodes of the third and fourth transistors.

4. The circuit of claim 1, further comprising a fifth transistor having a first current electrode coupled at the first node, a second current electrode coupled at the first voltage supply terminal, and a control electrode coupled at the output terminal, the fifth transistor having a conductivity type different from a conductivity type of the second transistor.

5. The circuit of claim 1, further comprising a fifth transistor having a first current electrode coupled to the second current electrode of the second transistor, a second current electrode coupled between a first diode connected transistor and a second diode connected transistor in the second plurality of transistors, and a control electrode coupled to a control electrode of the third transistor.

6. The circuit of claim 1, further comprising:
a first capacitor network coupled in parallel with the first plurality; and
a second capacitor network coupled in parallel with the second plurality.

7. The circuit of claim 6, wherein the first capacitor network includes:
a fifth transistor configured and arranged as a first capacitive element having a control electrode coupled at the input terminal and first and second current electrodes coupled at the output terminal; and
a sixth transistor configured and arranged as a second capacitive element having a control electrode coupled at the output terminal and first and second current electrodes coupled at the input terminal.

8. The circuit of claim 6, wherein the first capacitor network is configured to have an effective capacitance approximately equal to an effective capacitance of the second capacitor network and parasitic capacitance coupled at the output terminal.

9. The circuit of claim 1, wherein the first plurality and the second plurality each include the same number of transistors.

10. A circuit comprising:
a first plurality of transistors configured and arranged as diodes connected in series and coupled between an input terminal and an output terminal, each transistor of the first plurality having a body electrode coupled to a first voltage supply terminal;
a second plurality of transistors configured and arranged as diodes connected in series and coupled between the output terminal and the first voltage supply terminal;
a first transistor of the first plurality having a first current electrode and a control electrode coupled at the input terminal, the first transistor configured and arranged for receiving a signal at the input terminal having a voltage exceeding a voltage rating of the first transistor;
a second transistor having a first current electrode coupled to the first current electrode and the control electrode of the first transistor at the input terminal and a control electrode coupled to a voltage source terminal;
a third transistor having a first current electrode coupled to a second current electrode of the second transistor at a first node; and
a fourth transistor having a first current electrode coupled to a second current electrode of the third transistor and a second current electrode coupled at the output terminal.

11. The circuit of claim 10, further comprising:
a first capacitor network coupled in parallel with the first plurality; and
a second capacitor network coupled in parallel with the second plurality.

12. The circuit of claim 11, wherein the first capacitor network includes:
a fifth transistor configured and arranged as a first capacitive element having a control electrode coupled at the input terminal and first and second current electrodes coupled at the output terminal; and
a sixth transistor configured and arranged as a second capacitive element having a control electrode coupled at the output terminal and first and second current electrodes coupled at the input terminal.

13. The circuit of claim 11, wherein the first capacitor network is configured and arranged to have an effective capacitance approximately equal to an effective capacitance of the second capacitor network and parasitic capacitance coupled at the output terminal.

14. The circuit of claim 10, wherein each transistor of the second plurality includes a first current electrode connected to its control electrode and a second current electrode connected to its body electrode.

15. The circuit of claim 10, further comprising a fifth transistor having a first current electrode coupled at the first node, a second current electrode coupled at the first voltage supply terminal, and a control electrode coupled at the output terminal, the fifth transistor having a conductivity type different from a conductivity type of the second transistor.

16. The circuit of claim 10, further comprising a fifth transistor having a first current electrode coupled to the second current electrode of the second transistor, a second current electrode coupled between a first diode connected transistor and a second diode connected transistor in the second plurality of transistors, and a control electrode coupled to a control electrode of the third transistor.

17. A circuit comprising:
a first plurality of transistors configured and arranged as diodes connected in series and coupled between an input terminal and an output terminal, each transistor of the first plurality having a body electrode coupled to a first voltage supply terminal;
a second plurality of transistors configured and arranged as diodes connected in series and coupled between the output terminal and the first voltage supply terminal, each transistor of the second plurality including a first current electrode connected to its control electrode and a second current electrode connected to its body electrode;

a first transistor of the first plurality having a first current electrode and a control electrode coupled at the input terminal, the first transistor configured and arranged for receiving a signal at the input terminal having a voltage exceeding a voltage rating of the first transistor;

a second transistor having a first current electrode coupled to the first current electrode and the control electrode of the first transistor at the input terminal and a control electrode coupled to a voltage source terminal;

a third transistor having a first current electrode coupled to a second current electrode of the second transistor at a first node; and a fourth transistor having a first current electrode coupled to a second current electrode of the third transistor and a second current electrode coupled at the output terminal.

18. The circuit of claim 17, further comprising:
a first capacitor network coupled in parallel with the first plurality; and
a second capacitor network coupled in parallel with the second plurality.

19. The circuit of claim 18, wherein the first capacitor network includes:
a fifth transistor configured and arranged as a first capacitive element having a control electrode coupled at the input terminal and first and second current electrodes coupled at the output terminal; and
a sixth transistor configured and arranged as a second capacitive element having a control electrode coupled at the output terminal and first and second current electrodes coupled at the input terminal.

20. The circuit of claim 17, further comprising a fifth transistor having a first current electrode coupled at the first node, a second current electrode coupled at the first voltage supply terminal, and a control electrode coupled at the output terminal, the fifth transistor having a conductivity type different from a conductivity type of the second transistor.

* * * * *